United States Patent
Zanotto et al.

(10) Patent No.: US 10,125,963 B2
(45) Date of Patent: Nov. 13, 2018

(54) ELONGATED LIGHTING DEVICE WITH MARKS FOR CUTTING TO LENGTH AND METHOD

(71) Applicant: OSRAM GmbH, Munich (DE)

(72) Inventors: Alberto Zanotto, Padua (IT); Alberto Alfier, Vedelago (IT); Simone Massaro, Venice (IT)

(73) Assignee: OSRAM GmbH, Munich (DE)

( * ) Notice: Subject to any disclaimer, the term of this patent is extended or adjusted under 35 U.S.C. 154(b) by 266 days.

(21) Appl. No.: 14/864,878

(22) Filed: Sep. 25, 2015

(65) Prior Publication Data

US 2016/0091157 A1  Mar. 31, 2016

(30) Foreign Application Priority Data

Sep. 26, 2014  (IT) .............................. TO2014A0764

(51) Int. Cl.

| | |
|---|---|
| *F21V 23/00* | (2015.01) |
| *F21V 23/06* | (2006.01) |
| *H05K 1/02* | (2006.01) |
| *F21S 4/24* | (2016.01) |
| *F21S 4/28* | (2016.01) |
| *F21V 31/00* | (2006.01) |
| *H05K 3/00* | (2006.01) |
| *H05K 3/28* | (2006.01) |
| *F21Y 103/10* | (2016.01) |
| *F21Y 115/10* | (2016.01) |

(52) U.S. Cl.
CPC ............... *F21V 23/06* (2013.01); *F21S 4/24* (2016.01); *F21S 4/28* (2016.01); *H05K 1/0269* (2013.01); *F21V 31/00* (2013.01); *F21Y 2103/10* (2016.08); *F21Y 2115/10* (2016.08); *H05K 3/0052* (2013.01); *H05K 3/28* (2013.01); *H05K 2201/10106* (2013.01); *H05K 2203/0228* (2013.01)

(58) Field of Classification Search
CPC .. F21Y 2103/10; F21V 23/005; F21V 23/007; G09F 2103/222
See application file for complete search history.

(56) References Cited

U.S. PATENT DOCUMENTS 3,894,225 A * 7/1975 Chao ...................... G09F 13/28
                                                         174/117 A
4,173,035 A * 10/1979 Hoyt ...................... F21S 10/00
                                                         361/749

(Continued)

FOREIGN PATENT DOCUMENTS

| CN | 101877382 A | 11/2010 |
|---|---|---|
| KR | 1020140001494 A | 1/2014 |

OTHER PUBLICATIONS

Italian Search Report based on Application No. TO2014A000764 (4 Pages) dated May 19, 2015 (Reference Purpose Only).

*Primary Examiner* — Ismael Negron
(74) *Attorney, Agent, or Firm* — Viering, Jentschura & Partner mbB

(57) ABSTRACT

A lighting device includes an elongated support member, a plurality of light sources, at least one electrically conductive layer for interconnecting the light sources, and covering layer provided over the light source and conductive layer, the covering layer having discontinuities defining a marker array for cutting to length the lighting device.

5 Claims, 1 Drawing Sheet

(56) References Cited

U.S. PATENT DOCUMENTS

| | | | | |
|---|---|---|---|---|
| 4,761,720 A | * | 8/1988 | Solow | F21V 21/0808 |
| | | | | 362/235 |
| 5,559,681 A | * | 9/1996 | Duarte | F21V 21/08 |
| | | | | 362/231 |
| 5,769,533 A | * | 6/1998 | Yamuro | F21S 4/24 |
| | | | | 362/227 |
| 5,848,837 A | * | 12/1998 | Gustafson | B64F 1/002 |
| | | | | 362/235 |
| 6,183,104 B1 | | 2/2001 | Ferrara | |
| 6,866,398 B2 | * | 3/2005 | Lin | F21S 4/26 |
| | | | | 362/244 |
| 8,388,182 B2 | * | 3/2013 | Chang | F21V 19/0015 |
| | | | | 362/249.02 |
| 8,511,856 B2 | * | 8/2013 | Brauser | A01K 27/006 |
| | | | | 119/859 |
| 8,629,464 B2 | * | 1/2014 | Roberts | F21V 29/74 |
| | | | | 257/88 |
| 8,657,468 B2 | * | 2/2014 | Im | F21S 48/1109 |
| | | | | 174/254 |
| 9,379,289 B1 | * | 6/2016 | Lindblad | H01L 33/44 |
| 2008/0049420 A1 | * | 2/2008 | Smith | F21S 4/24 |
| | | | | 362/231 |
| 2010/0270579 A1 | | 10/2010 | Jo | |
| 2012/0235172 A1 | | 9/2012 | Roberts | |

* cited by examiner

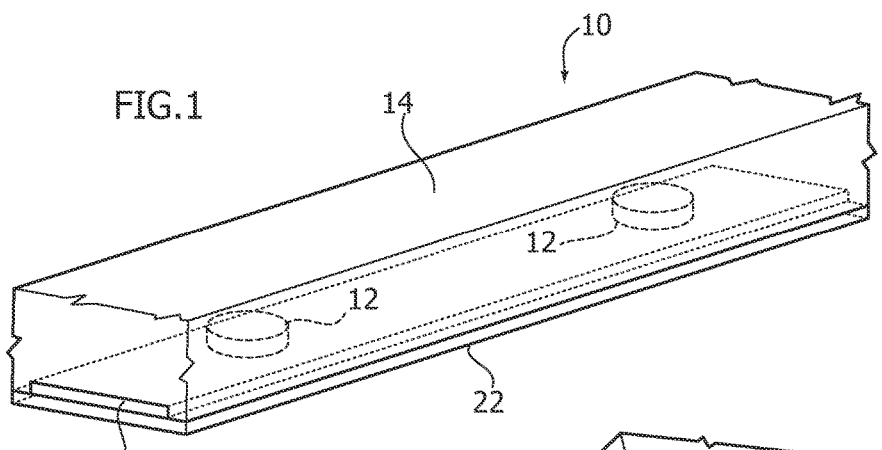
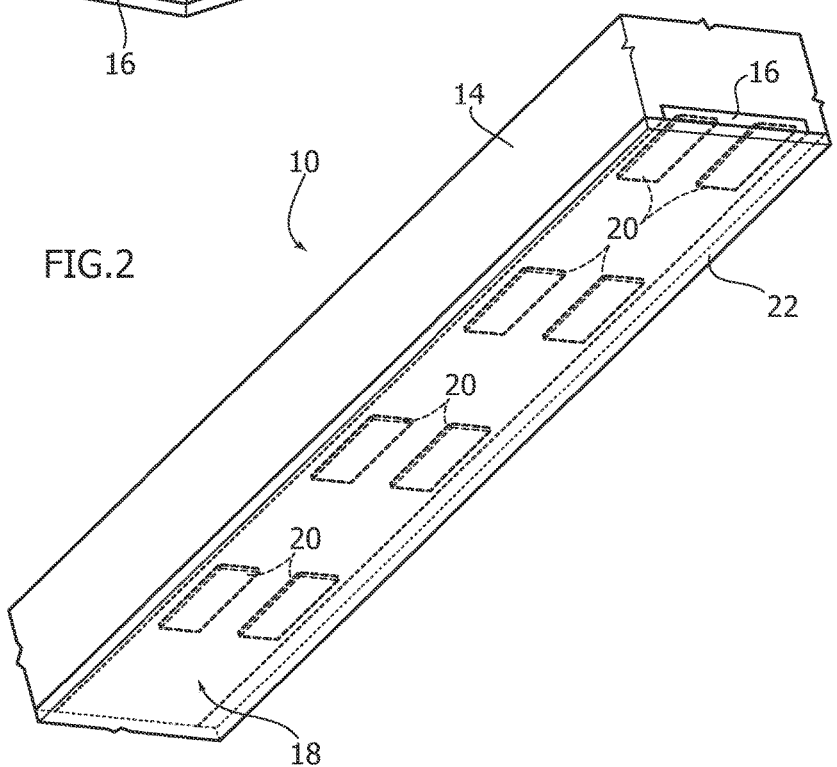
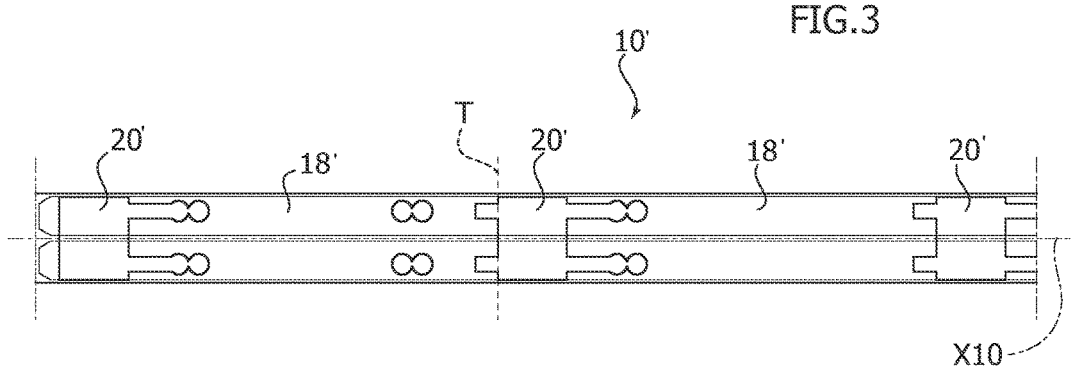

ELONGATED LIGHTING DEVICE WITH MARKS FOR CUTTING TO LENGTH AND METHOD

CROSS-REFERENCE TO RELATED APPLICATION

This application claims priority to Italian Patent Application Serial No. TO2014A000764, which was filed Sep. 26, 2014, and is incorporated herein by reference in its entirety.

TECHNICAL FIELD

Various embodiments may generally relate to lighting devices.

One or more embodiments may find an application in lighting devices employing solid state light radiation sources such as, for example, LED sources.

BACKGROUND

Linear LED modules are an example of lighting devices exhibiting modularity. Modularity in a product enables cutting the module to length at certain fixed points.

In various implementations, the cutting points and the corresponding circuit are visible to the final user from the front or top side (i.e. the side carrying the light radiation sources, e.g. the LEDs) or they may be made visible via a particular marking (e.g. ink or laser printing).

In a protected module, where no transparent materials are used, the cutting points which may be present on the device support (for example a Printed Circuit Board, PCB) may not be recognizable through a direct observation of the circuit and/or the marking. When an opaque material is used, it is impossible to identify the cutting points by observing the position of the LEDs or the associated electronics, which are not visible. This is an intrinsic limit for those applications wherein the module must be cut to length.

This problem may be countered in protected modules through a marking (e.g. a laser marking) of cutting points on one side of the module. The alignment of cutting points may be based on the position of the light radiation sources, adapted to be the only visible components.

This approach is critical due to the tolerances of the marking, to the possible shrinkage of different materials during the process and to the need, in the positioning of the module, of aligning the marking with the layout of the support (e.g. of the PCB).

These problems have been found to be virtually unsolvable if the support (e.g. the PCB) and/or the components are not visible to the final user, so that the module may be cut but, for example, without offering the possibility to reconnect a part of the module.

SUMMARY

Various embodiments aim at overcoming the previously outlined drawbacks.

According to various embodiments, said object is achieved thanks to a lighting device having the features specifically set forth in the claims that follow.

Various embodiments may also concern a corresponding method.

In various embodiments it becomes possible to obtain a lighting module, e.g. a LED lighting module, adapted to be cut in different points without the need of seeing the module top side.

Various embodiments may achieve one or more of the following advantages:
- the possibility to cut the module to length even when the top or front side of the module is completely masked or covered, with the consequent impossibility to find any reference point for the cutting,
- the possibility to implement the connection of the module on both the top and the bottom side,
- a higher flexibility in production, thanks to the presence of reference positions also during in-line testing or laser marking, without negative effects due to components tolerances, also as regards the positioning and assembling thereof,
- a lower cost of raw materials, thanks to the possibility to use e.g. a solder mask instead of a PI coverlayer at the bottom or back layer.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 is a perspective view of a device according to various embodiments,

FIG. 2 is a view of a device according to various embodiments, viewed from an observation point approximately opposite the observation point of FIG. 1, and FIG. 3 is a view highlighting features of a device according to various embodiments.

DETAILED DESCRIPTION

In the following description, numerous specific details are given to provide a thorough understanding of one or more exemplary embodiments. The embodiments may be practiced without one or several specific details, or with other methods, components, materials, etc. In other instances, well-known structures, materials, or operations are not shown or described in detail to avoid obscuring various aspects of the embodiments. Reference throughout this specification to "one embodiment" or "an embodiment" means that a particular feature, structure, or characteristic described in connection with the embodiment is included in at least one embodiment. Thus, the possible appearances of the phrases "in one embodiment" or "in an embodiment" in various places throughout this specification are not necessarily all referring to the same embodiment. Furthermore, particular features, structures, or characteristics may be combined in a suitable manner in one or more embodiments, and/or may be associated to the embodiments in a different way from what is shown herein, so that e.g. a feature herein exemplified in connection to a Figure may be applied to one or more embodiments exemplified in a different Figure.

The headings provided herein are for convenience only, and therefore do not interpret the scope or meaning of the embodiments.

In the Figures, reference 10 denotes on the whole a module, or a solid state lighting device. Wherein reference 10 refers to module 10 in FIG. 2 and module 10' in FIG. 3.

This lighting device may consist, in various embodiments, of a so-called LED module, including electrically powered light radiation sources 12, e.g. LED light radiation sources, arranged on an elongated support member 14.

As far as the present description is concerned, module 10 may be considered as including a (optionally flexible) bar or strip of a generally undefined length. In various embodiments the need is present to cut such a module 10 to length, at cutting positions which are identified with sufficient precision, so as to obtain a lighting device of a desired length.

Support member 14 may have different shapes, according to the adopted implementation.

For example, support member 14 may include an elongated support element 16, e.g. a Printed Circuit Board (PCB).

In various embodiments, on the basis of the application and design requirements (power supply currents, features of electronic circuits, thermal characteristics), support board 16 may include various layers of a conductive material, e.g. copper.

In various embodiments, there may be provided a single layer PCB 16, having one single layer of conductive material applied on the base material, e.g. by using a special adhesive.

The exposed side of the conductive layer may require covering via a covering layer 18, wherein 18 refers to covering layer 18 in FIG. 2 and covering layer 18' in FIG. 3, adapted to prevent the conductive metal layer (e.g. copper) from oxidizing.

In various embodiments, there may be provided a double layer PCB 16, having two layers of conductive material (e.g. copper) applied on the opposing sides of a base material layer. In this case, too, there may be provided a covering layer 18, e.g. having a protection function of the electrically conductive layers.

In this regard it may moreover be observed that, in lighting (e.g. LED) modules as exemplified herein, the light radiation sources and the components associated thereto may be mounted on the top or front side of module 10, while the bottom (or back) side is not used for mounting components and is coated by a cover layer 18 to ensure electrical isolation.

In various embodiments, the covering layer may be made of different materials, such as resins as polyimmide (PI), polyethylene terephthalate (PET), polyethylene naphthalate (PEN).

When there is no need to provide an electrical insulation, the covering layer may consist of a finishing material (Organic Solderability Preservative (OSP), silver, gold, etc.).

In various embodiments, such a covering layer 18 may also include or consist of a solder mask.

Whatever the specific implementation details, in such a modular device 10 both the light radiation sources (e.g. LEDs 12 shown in FIG. 1) and the electrical contacts, e.g. dedicated pads connected to such sources, may not be visible from the outside.

In various embodiments, as schematically shown in FIG. 3, covering layer 18 (whatever it may consist of) may have, as better exemplified in FIG. 3, discontinuities 20, wherein reference 20 refers to discontinuities 20 in FIG. 2 and discontinuities 20' in FIG. 3, which are located for example at the bottom (or back) side of module 10 and through which the pads of electrical (and/or possibly thermal) contact are visible.

This may take place also if on the bottom (or back) side of module 10 there is applied a further layer 22 of a light permeable (transparent) material, adapted to seal device 10 while imparting protection features against the penetration of foreign agents (IP protection).

In various embodiments discontinuities 20, which are regularly spaced along the lengthwise extension of device 10, may create a marking scale for cutting to length modular lighting device 10.

In this way, discontinuities 20 may act as markers for the cutting operation, being arranged according to a regular pattern, e.g. as openings in covering layer 18 (whatever the latter may be: a cover layer, a solder mask, etc.).

Thanks to their regular distribution, discontinuities 20 may therefore act as an array of markers, which are located at particular positions along the lengthwise extension of module 10 (axis X10 in FIG. 3), creating references which enable cutting module 10 to length (see for example the cutting line denoted by T in FIG. 3) without the need of markers located, e.g., on the front (or top) side or on the lateral sides of module 10.

It will be appreciated, moreover, that the solution according to various embodiments can be applied also in those cases wherein (unlike the previously described examples) the observation of the front side or of the lateral sides of module 10 might in itself enable spotting the position of components within module 10.

Various embodiments enable the alignment of a laser marking with respect to the layout of elongated support element 16 (e.g. in order to identify the positions of light radiation sources 12). This operation may be performed e.g. on an edge of a protected module 10 where an opaque material is present on the front side, so as to mask all components, including LEDs, while layer 22, which may be a transparent material layer, is applied on the bottom or back side of module 10, in order to provide the latter with an IP (Ingress Protection).

It will be appreciated that various embodiments enable to keep a high level of accuracy in the production and in the identification of circuits by final users. This applies e.g. to the position of light radiation sources 12: the marking layout given by discontinuities 20 in covering layer may actually correspond to the circuit layout, adapted to be implemented with a higher accuracy than is the case with the positioning of components on the circuit itself, which may be affected by size, positioning and assembling tolerances.

In various embodiments, a laser marking may be controlled by a camera observing the back side of module 10.

This advantage may be appreciated also during production, as discontinuities 20 in covering layer 18 may correspond to openings for accessing electrical connection pads for the module components. This may e.g. simplify testing operations, giving the possibility to extend testing operation to an access on both front and back side of module 10.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A modular lighting device configured to be cut to length, comprising:
   an elongated printed circuit board having a front side with a first electrically conductive layer covered with a first covering layer, and a back side with a second electrically conductive layer covered with a second covering layer, said second covering layer exhibits discontinuities forming a marker array for cutting to length the modular lighting device;

a plurality of electrically powered light radiation sources mounted on the front side and not on the back side; and a light permeable layer extending over said second covering layer and said discontinuities.

2. The lighting device of claim 1, wherein said second covering layer with said discontinuities is arranged facing outside the device, whereby said discontinuities forming the marker array are visible from outside the device.

3. The lighting device of claim 1, wherein said at least one of the first or the second electrically conductive layer includes a copper layer.

4. A method of producing a modular lighting device, comprising:

providing an elongated printed circuit board having a front side and a back side;

providing a first electrically conductive layer covered with a first covering layer on the front side, providing a second electrically conductive layer covered with a second covering layer on the backside, wherein said second covering layer exhibits regularly spaced discontinuities forming a marker array for cutting to length said modular lighting device, arranging a plurality of electrically powered light radiation sources on the front side of the elongated printed circuit board and not on the backside, and providing a light permeable layer extending over said second covering layer and said discontinuities.

5. The method of claim 4, further comprising providing said second covering layer with said discontinuities facing to the exterior of the device, whereby said discontinuities forming the marker array are visible from outside the device.

* * * * *